US007241695B2

(12) United States Patent
Mathew et al.

(10) Patent No.: US 7,241,695 B2
(45) Date of Patent: Jul. 10, 2007

(54) SEMICONDUCTOR DEVICE HAVING NANO-PILLARS AND METHOD THEREFOR

(75) Inventors: Leo Mathew, Austin, TX (US); Rajesh A. Rao, Austin, TX (US); Ramachandran Muralidhar, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 22 days.

(21) Appl. No.: 11/244,516

(22) Filed: Oct. 6, 2005

(65) Prior Publication Data

US 2007/0082495 A1    Apr. 12, 2007

(51) Int. Cl.
*H01L 21/302* (2006.01)

(52) U.S. Cl. .................. 438/719; 438/253; 438/585

(58) Field of Classification Search ............. 438/706, 438/710, 714, 719, 721, 722, 723, 238, 253, 438/585
See application file for complete search history.

(56) References Cited

U.S. PATENT DOCUMENTS

| | | | |
|---|---|---|---|
| 6,060,743 A * | 5/2000 | Sugiyama et al. .......... 257/321 |
| 6,297,095 B1 | 10/2001 | Muralidhar et al. | |
| 6,576,532 B1 | 6/2003 | Jones et al. | |
| 6,753,250 B1 * | 6/2004 | Hill et al. .................. 438/637 |
| 6,995,439 B1 * | 2/2006 | Hill et al. .................. 257/396 |
| 7,071,047 B1 * | 7/2006 | Furukawa et al. .......... 438/197 |
| 2002/0185948 A1 * | 12/2002 | Dunfield et al. ............ 313/309 |
| 2003/0235064 A1 * | 12/2003 | Batra et al. ................. 365/100 |
| 2004/0159881 A1 | 8/2004 | Chindalore et al. | |
| 2005/0266652 A1 * | 12/2005 | Chudzik et al. ............ 438/387 |

OTHER PUBLICATIONS

Koga et al; "Silicon Single-Electron Memory & Logic Devices for Room Temperature Operation"; 2001 IEDM/IEEE pp. 7.1.1-7.1.14.
Tiwari et al; "Volatile and Non-Volatile memories in Silicon with Nano-Crystal Storage", 1995 IEDM/IEEE, pp. 20.4.1-20.4.4.

* cited by examiner

*Primary Examiner*—Kin-Chan Chen
(74) *Attorney, Agent, or Firm*—Daniel D. Hill; David G. Dolezal; Ranjeev Singh

(57) ABSTRACT

A semiconductor device includes a plurality of pillars formed from a conductive material. The pillars are formed by using a plurality of nanocrystals as a hardmask for patterning the conductive material. A thickness of the conductive material determines the height of the pillars. Likewise, a width of the pillar is determined by the diameter of a nanocrystal. In one embodiment, the pillars are formed from polysilicon and function as the charge storage region of a non-volatile memory cell having good charge retention and low voltage operation. In another embodiment, the pillars are formed from a metal and function as a plate electrode for a metal-insulator-metal (MIM) capacitor having an increased capacitance without increasing the surface area of an integrated circuit.

19 Claims, 3 Drawing Sheets

SEMICONDUCTOR DEVICE HAVING NANO-PILLARS AND METHOD THEREFOR

FIELD OF THE INVENTION

This invention relates generally to integrated circuits and more specifically to a semiconductor device having nano-pillars and method therefor.

BACKGROUND OF THE INVENTION

Electrically erasable programmable read only memory (EEPROM) structures are commonly used in integrated circuits for non-volatile data storage. An EEPROM device structure commonly includes a floating gate for storing charge. Charge can be forced into the floating gate structure or removed from the floating gate structure using control voltages. The conductivity of the channel underlying the floating gate is altered by the presence of charges stored in the floating gate. The conductivity difference is represented by a shift in the threshold voltage ($V_T$) associated with the device in the two different states. The difference in conductivity due to a charged or uncharged floating gate can be sensed, thus allowing binary memory states to be determined.

In many prior art non-volatile memory devices, the floating gate is formed from a uniform layer of material such as polysilicon. In such prior art device structures, a thin tunnel dielectric layer beneath the floating gate presents the problem of charge leakage from the floating gate to the underlying channel through defects in the thin tunnel dielectric layer. Such charge leakage can lead to degradation of the memory state stored within the device and is therefore undesirable. In order to avoid such charge leakage, the thickness of tunnel dielectric is often increased. However, a thicker tunnel dielectric requires higher programming and erasing voltages for storing and removing charge from the floating gate as the charge carriers must pass through the thicker tunnel dielectric. In many cases, higher programming voltages increase power consumption and may require the implementation of charge pumps in order to increase the supply voltage to meet programming voltage requirements. Such charge pumps consume a significant amount of die area for the integrated circuit and therefore reduce the memory array area efficiency and increase overall costs.

Because of the above described problems, other materials are being developed to substitute for the typical floating gate charge storage regions. In order to reduce the required thickness of the tunnel dielectric and improve the area efficiency of the memory structures by reducing the need for charge pumps, the uniform layer of material used for the floating gate may be replaced with a plurality of nanoclusters, which operate as isolated charge storage elements. Such nanoclusters are also often referred to as nanocrystals, as they may be formed of silicon crystals. In combination, the plurality of nanoclusters provide adequate charge storage capacity while remaining physically isolated from each other such that any leakage occurring with respect to a single nanocluster via a local underlying defect does not cause charge to be drained from other nanoclusters (by controlling average spacing between nanoclusters, it can be ensured that there is no lateral charge flow between nanoclusters in the floating gate). However, a charge storage layer formed from nanoclusters or nanocrystals will not store as much charge as a floating gate formed from polysilicon. Because the nanocrystals will not store as much charge, the voltage difference between programmed and erased states may be relatively small, leading to sensing and reliability problems.

Therefore, it is desirable to provide an integrated circuit device that will store more charge than a nanocrystal memory device and yet provide low voltage program and erase operations.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates identical items unless otherwise noted. Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally, the present invention provides in one embodiment a method for forming structures on a semiconductor substrate using nanocrystals as a hardmask. In one embodiment, the structures are pillar shaped and have a thickness that is determined by the diameter of one nanocrystal. In another embodiment, a plurality of pillars are formed of polysilicon and used as the charge storage region of a non-volatile memory cell. In another embodiment, a plurality of pillars is formed from a metal and functions as a plate electrode for a relatively large metal-insulator-metal (MIM) capacitor. Generally, the MIM capacitor is formed in the last two metal layers of a semiconductor device; however, the MIM capacitor can be formed anywhere in the interconnect layers or on a semiconductor substrate.

By using nanocrystals as the hardmask to form a plurality of pillars on a semiconductor device, a non-volatile memory may be formed having a charge storage layer that can store more charge than a comparable memory using nanocrystals for charge storage. Because the pillars can store more charge, the memory will have a better $V_T$ difference between erased and programmed states. Also, the memory will require a lower programming voltage than a comparable floating gate memory.

Using the pillars to form a MIM capacitor allows a MIM capacitor having larger plate electrodes without consuming more surface area on an integrated circuit.

The following sets forth a detailed description of a mode for carrying out the invention. The description is intended to be illustrative of the invention and should not be taken to be limiting.

Figure 1:
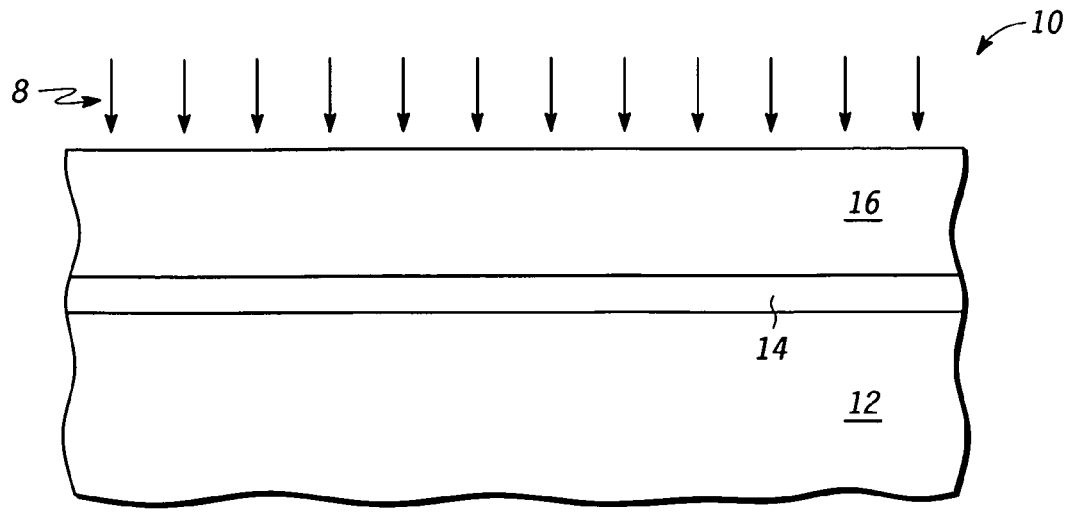
FIG. 1 illustrates a portion of a semiconductor device 10 after an oxide layer and a conductive layer have been formed.

FIGS. 1-6 illustrate a portion of a semiconductor device 10 and a method for making a semiconductor device 10 in accordance with one embodiment of the present invention. FIG. 1 illustrates a portion of the semiconductor device 10 after a conductive layer 16 has been deposited. In FIG. 1, a dielectric layer 14 is formed over a semiconductor substrate 12. In the illustrated embodiment, semiconductor substrate 12 includes silicon. In other embodiments, substrate 12 may be another material such as gallium arsenide. The dielectric layer 14 is formed by thermal oxidation of the semiconductor substrate 12. Dielectric layer 14 may also be a high K dielectric such as for example hafnium oxide, aluminum oxide, or halfnium silicate. Also, in the illustrated embodiment, the dielectric layer 14 is about 2 to 7 nanometers (nm) thick. In other embodiments, the dielectric layer 14 may be a different thickness.

The conductive layer 16 is deposited over the dielectric layer 14. In one embodiment, the conductive layer 16 is polysilicon. In another embodiment, the conductive layer 16 may be another conductive material such as for example a metal such as aluminum, TaN, TiN, tungsten, etc. The thickness of conductive layer 16 determines the height of the plurality of nano-pillars. In one embodiment, the thickness of conductive layer 16 is between about 10 to 50 nm. Optionally, the conductive layer 16 may be implanted with ion implantation 8 to add dopants to the conductive layer 16 to form a channel region for a non-volatile memory cell. In other embodiments, conductive layer 16 may be doped with single or multiple implants at various energies, angles, and/or species.

Figure 2:
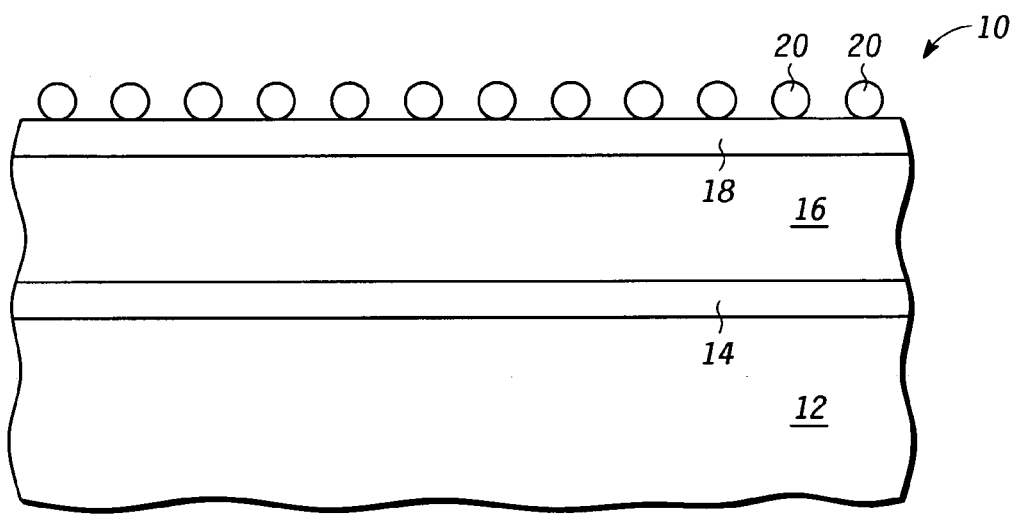
FIG. 2 illustrates a portion of the semiconductor device of FIG. 1 after nanocrystals have been formed.

FIG. 2 illustrates a portion of the semiconductor device of FIG. 1 after a plurality of nanocrystals 20 have been formed over the doped conductive layer 16. In one embodiment, the nanocrystals 20 are formed using a conventional chemical vapor deposition (CVD) technique to nucleate and grow the nanoclusters directly on an insulating layer 18. In the illustrated embodiment, the layer 18 is deposited silicon oxide having a thickness of between about 5 to 20 nm. In other embodiments, the layer 18 may be silicon nitride. Each of the plurality of nanocrystals has a diameter of between about 3 to 12 nm. Preferably, the nanocrystals are relatively uniformly spaced apart with a spacing between nanocrystals that is equal to approximately the diameter of a nanocrystal.

Figure 3:
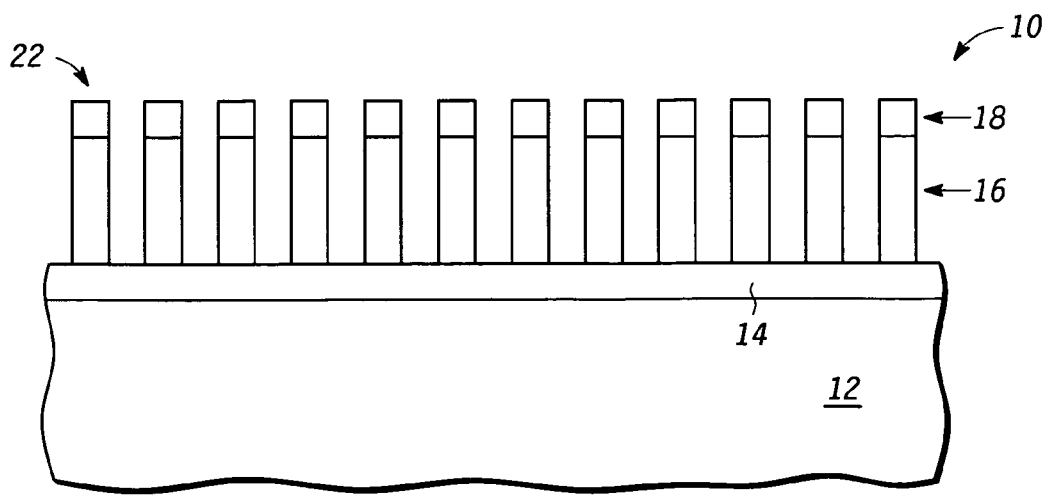
FIG. 3 illustrates the semiconductor device of FIG. 2 after being patterned and etched to form pillars from the conductive layer.

FIG. 3 illustrates the semiconductor device 10 of FIG. 2 after conductive layer 16 is patterned and etched to form pillars 22. The nanocrystals 20, illustrated in FIG. 2 are used to pattern a plurality of pillars 22 on the conductive layer 16. The nanocrystals function as a hardmask for layer 18. An anisotropic dry etch process that is selective to dielectric layer 14 is used to remove conductive layer 16 from between the nanocrystals to form the pillars 22. If the nanocrystals are formed from the same material as the conductive layer 16, then the same anisotropic dry etch process that removes the conductive layer 16 also removes the nanocrystals as illustrated in FIG. 3. The diameter of the pillars 22 is determined by the size of the nanocrystals.

Figure 4:
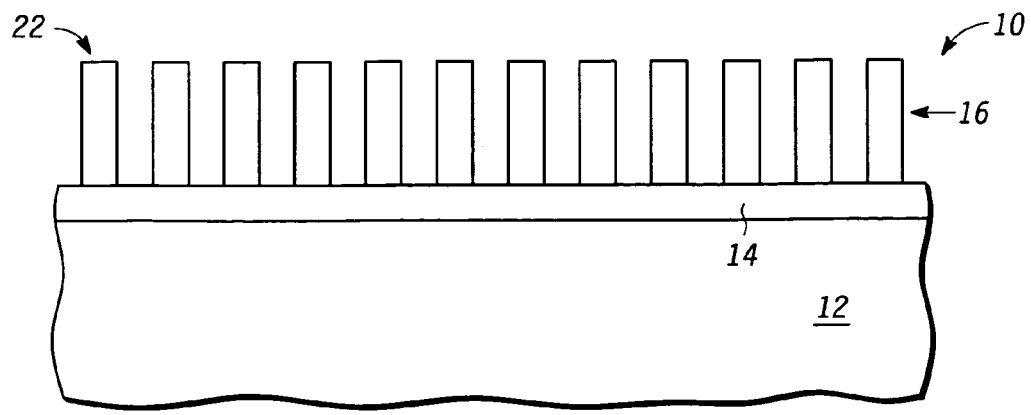
FIG. 4 illustrates the semiconductor device of FIG. 3 after an oxide layer is removed from a top of the pillars.

FIG. 4 illustrates the semiconductor device 10 of FIG. 3 after the oxide layer 18 is removed from the top of the pillars 22. A wet etch is used to remove the layer 18 and the nanocrystals if the nanocrystals were not removed as a result of the anisotropic dry etch described above. Optionally, in other embodiments, the layer 18 and the nanocrystals may be left on the pillars to provide additional charge storage capacity for a non-volatile memory.

Figure 5:
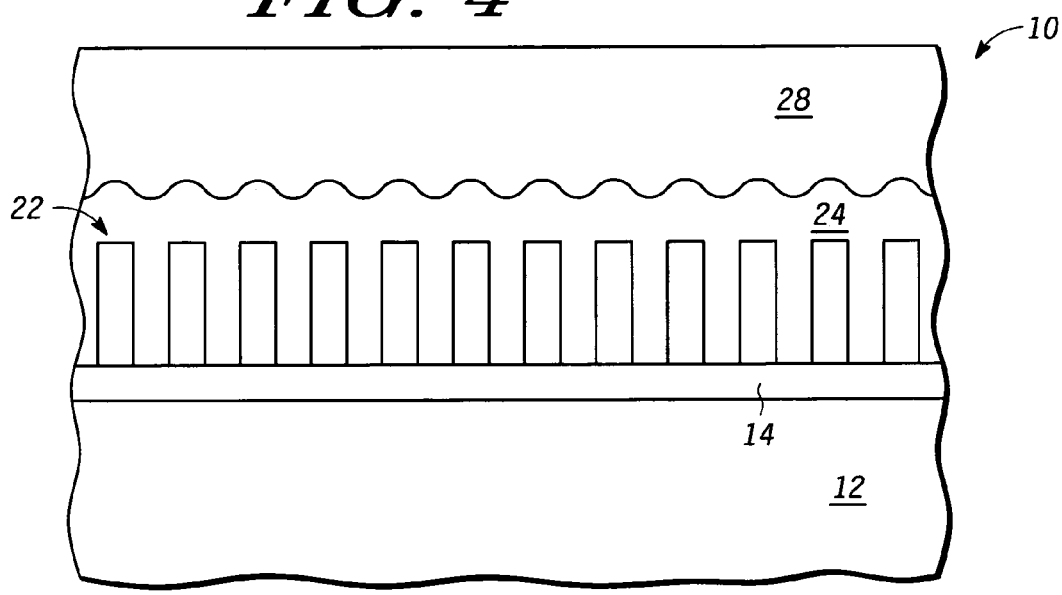
FIG. 5 illustrates the semiconductor device of FIG. 4 after an insulating layer is formed around and over the pillars followed by another conductive layer.

FIG. 5 illustrates the semiconductor device of FIG. 4 after a control dielectric layer 24 is formed around and over the pillars 22 followed by another conductive layer 28. Control dielectric layer 24 is deposited silicon dioxide. The silicon dioxide of layer 24 is deposited over and between all of the pillars 22, and is deposited to be, on average, about 7 to 12 nm above the top of the pillars 22. In other embodiments, the insulating layer 24 may be formed by partially oxidizing the silicon nano-pillars 22. Also, layer 22 may be a stacked dielectric, such as for example, an ONO (oxide-nitride-oxide) stack or a high K stack. A polysilicon layer 28 is deposited over the insulating layer 24 to a thickness of between about 100 to 200 nm.

Figure 6:
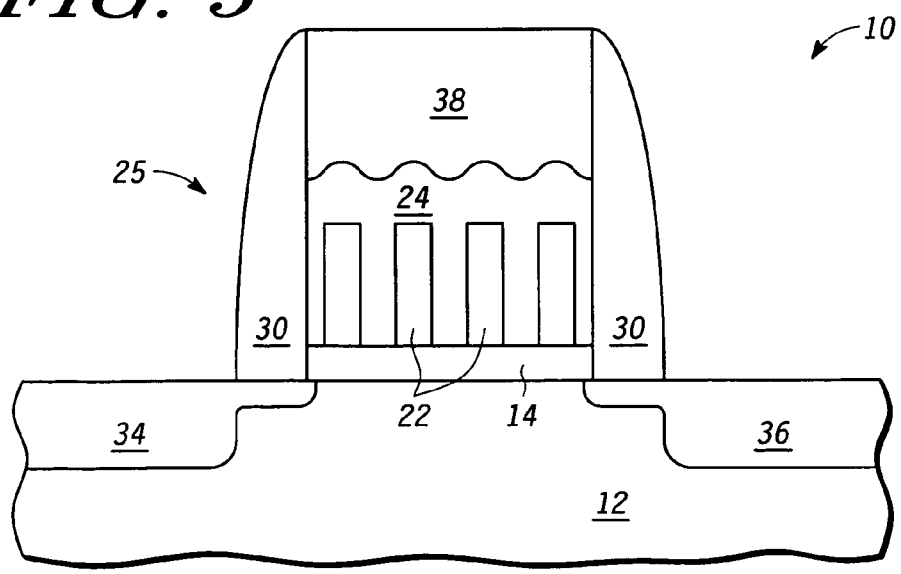
FIG. 6 illustrates the semiconductor device of FIG. 5 after further processing to form a non-volatile memory cell in accordance with one embodiment of the present invention.

FIG. 6 illustrates the semiconductor device of FIG. 5 after further processing to form a non-volatile memory cell 25 in accordance with one embodiment of the present invention. The polysilicon layer 28 is patterned and etched to form a control gate 38 over the control dielectric layer 24. Other conventional processing steps are performed to form the memory cell 25. For example, sidewall spacers 30 are formed on either side of the control gate 38. Also, drain/source regions and extensions 34 and 36 are diffused in the substrate 12 on both sides of the control gate 38. In addition, other conventional processing stages not shown or described herein may be performed on the semiconductor device 10 to form other conventional structures used for making a memory cell. For example, interconnects, contacts, and passivation layers are formed. Afterwards, a wafer including the semiconductor device 10 is singulated to separate the integrated circuits of the wafer.

The non-volatile memory cell 25 provides a non-volatile memory having the advantage of low voltage program and erase operations in addition to more charge storage capacity than a comparable nanocrystal memory.

Figure 7:
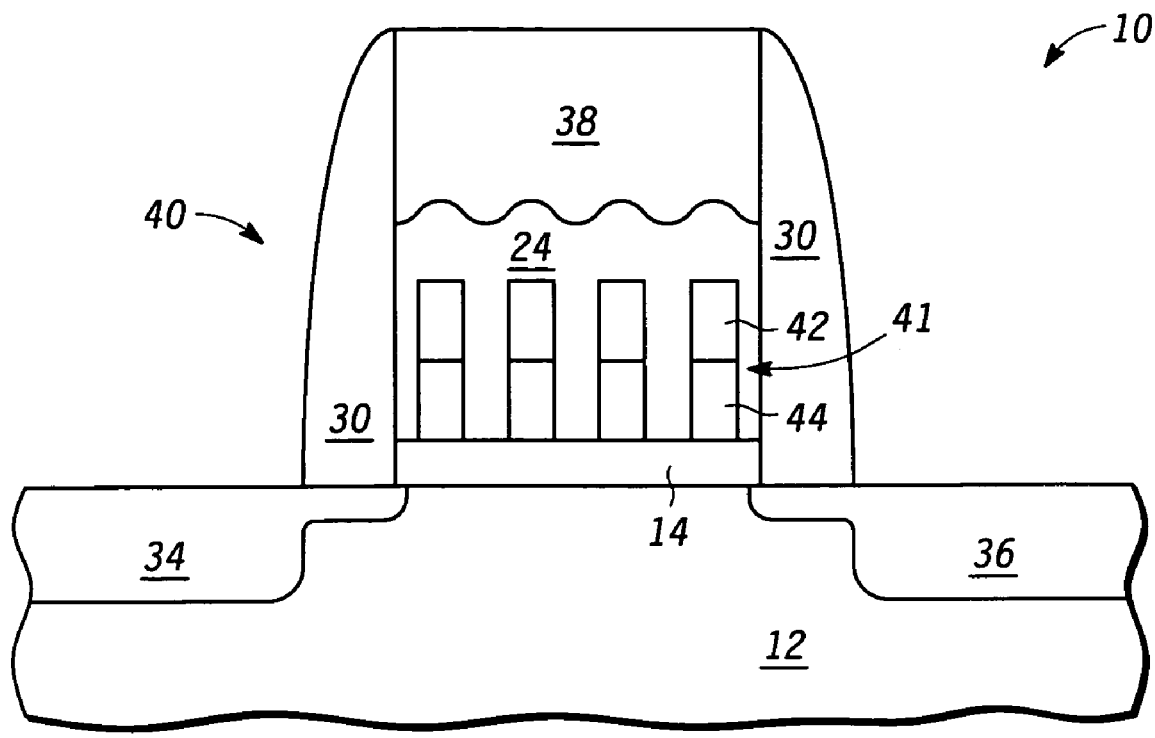
FIG. 7 illustrates a semiconductor device in accordance with another embodiment of the present invention.

FIG. 7 illustrates a semiconductor device 40 in accordance with another embodiment of the present invention. Semiconductor device 40 is the same as semiconductor device 10 except that semiconductor device 40 includes pillars 40 that comprise two semiconductor layers instead of the one layer illustrated in FIG. 6. In the semiconductor device 40, a semiconductor layer 44 is formed on dielectric layer 14, and a semiconductor layer 42 is formed over semiconductor layer 44 to form a floating gate for a non-volatile memory cell. Generally, semiconductor layer 44 is formed to have one conductivity type and semiconductor layer 42 has another conductivity type. Specifically, semiconductor layer 44 comprises N-doped polysilicon and semiconductor layer 42 comprises P-doped polysilicon. The polysilicon layers may be formed using in-situ doping, ion-implantation, or other method.

The semiconductor layers 42 and 44 together form a P-N junction that mitigates a typical problem with some floating gate type non-volatile memories called "read disturb". Read disturb is caused by an electric field that appears across the control dielectric when a memory cell is read. This electric field can cause charge stored on the floating gate to leak off. The electric field seen by the charge in the floating gate electrode is smaller during read operations than during write operations, but a nonvolatile memory may be read continuously for a large part of its life. After such prolonged periods of exposure to an electric field, the charge stored on the floating gate electrode can change, and cause a low threshold state to be indistinguishable from a high threshold state during a read operation. The use of the P-N junction as the floating gate of semiconductor device 40 allows the electric field to be lowered during a read operation, thus providing better immunity to read disturb. Similarly, by reversing the conductivity of semiconductor layers 42 and 44, the charge loss from the floating gate during data retention can be mitigated by lowering the field in the tunnel oxide.

Figure 8:
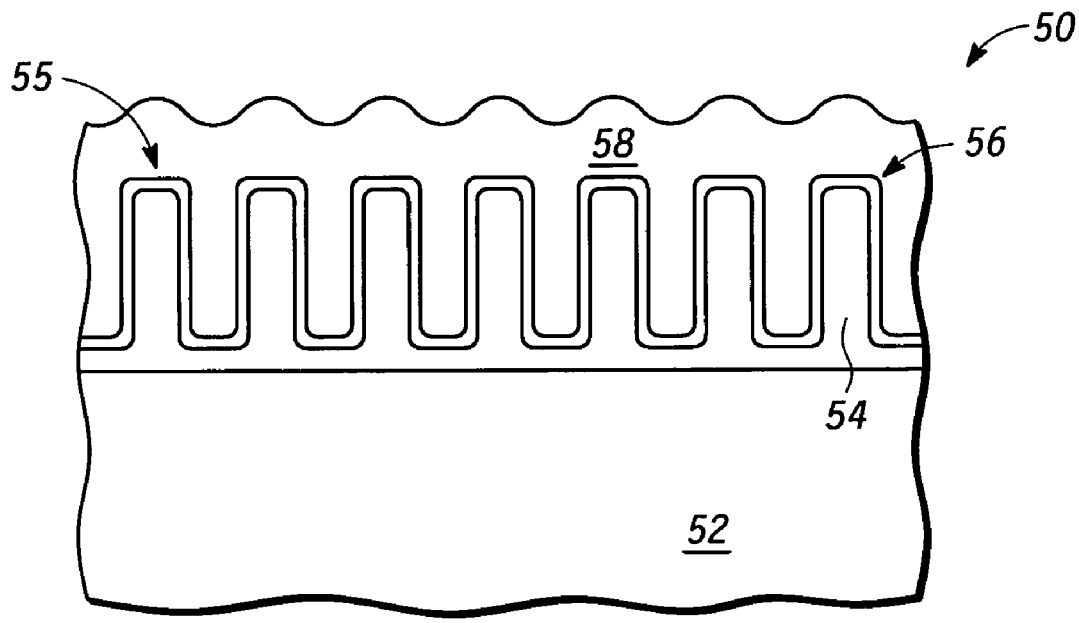
FIG. 8 illustrates a semiconductor device in accordance with yet another embodiment of the present invention.

FIG. 8 illustrates a semiconductor device 50 in accordance with another embodiment of the present invention. The semiconductor device 50 includes a MIM capacitor structure formed in accordance with the method described above, where nanocrystals are used as a hardmask to form a plurality of pillars 55 on the semiconductor device 50. Semiconductor device 50 includes an inter-level dielectric layer (ILD) 52. In the illustrated embodiment, ILD 52 is any insulating material suitable for supporting and electrically isolating a plurality of metal conductors. For example, ILD 52 may be formed from silicon dioxide. A metal layer 54 is deposited over ILD 52. The metal layer 54 may include copper, tantalum, tantalum nitride, and/or aluminum. The thickness of the metal layer 54 is important for determining the average pillar height of the plurality of pillars 55. The thickness of metal layer 54 is chosen such that there is sufficient metal remaining at the bottom of the pillars, after the metal layer 54 is etched, to minimize electrical resistance. In one embodiment, the thickness of metal layer 54 is between about 20 to 200 nm.

The plurality of pillars 55 are formed in the same manner as the plurality of pillars 16 in FIG. 3. An insulating layer (insulating layer 18 in FIG. 2) is formed over the metal layer 54. A plurality of nanocrystals (nanocrystals 20 in FIG. 2) is formed using a conventional CVD process to nucleate and grow the nanoclusters directly on the insulating layer over the metal layer 54. In FIG. 7, each of the plurality of nanocrystals has a diameter of between about 10 to 20 nm. Preferably, the nanocrystals are relatively uniformly spaced apart with a spacing between nanocrystals of about 20 to 40 nm. Unlike the method described above, the anisotropic dry etch is timed so as to prevent metal layer 54 from being etched through to ILD 52. A wet etch is then used to remove the insulating layer and the nanocrystals that formed the hardmask as described above in the discussion of FIG. 4. The pillars 55 function as part of the bottom plate electrode for the capacitor. A dielectric layer 56 is deposited over the sides and top of each of the pillars 55 to a thickness of between about 5-10 nm. The dielectric layer 56 functions as the MIM capacitor insulator and may be any conventional insulator material such as silicon nitride, hafnium oxide, tantalum pentoxide, silicon dioxide, and aluminum oxide, and stacked combinations thereof.

A metal layer 58 is formed over the dielectric layer 56 and functions as the top plate electrode. The metal may be the same as, or different from, the bottom plate electrode. Typically, the top plate electrode is copper or tungsten or aluminum. Additional processing steps may be included to add one or more additional interconnect layers (not shown) above the top plate electrode. For example, a top metal layer above the MIM capacitor may be used for routing power supply conductors and the MIM capacitor is coupled to the power supply conductors for performing a decoupling application.

The pillars 55 of the MIM capacitor provide the advantage of increased plate electrode area without increasing the surface area used on an integrated circuit that implements the MIM capacitor.

The embodiment described as shown in FIG. 8 is a MIM capacitor formed just below the final interconnect layer. However, those skilled in the art will realize that the MIM capacitor may be formed anywhere above the semiconductor substrate. For example, the MIM capacitor may be formed below the first interconnect layer, above the final interconnect layer, or anywhere in between. Note that there are related structures, not explicitly shown in the figures, which are generally always present on-chip as essential parts of the IC interconnect circuitry.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

What is claimed is:

1. A method comprising:
    forming a first layer;
    forming a plurality of nanoclusters over the first layer;
    patterning the first layer, wherein the patterning the first layer includes etching using the plurality of nanoclusters as a hard mask, wherein the patterning the first layer includes forming a plurality of patterned structures of the first layer; and
    forming a first capacitor electrode of a capacitor, wherein the forming the first capacitor electrode includes forming a layer of conductive material over patterned structures of the plurality of patterned structures of the first layer, wherein a second capacitor electrode of the capacitor includes patterned structures of the plurality of patterned structures of the first layer.

2. The method of claim 1, wherein:
    a second layer is formed over the first layer and the plurality of nanoclusters are formed over the second layer; and
    the etching using the plurality of nanoclusters as a hard mask includes etching the second layer using the plurality of nanoclusters as a hard mask to form a plurality of patterned structures of the second layer;
    wherein the patterning includes etching the first layer using the plurality of patterned structures of the second layer as a hard mask.

3. The method of claim 2 wherein the second layer includes dielectric material.

4. The method of claim 1 wherein the first layer includes charge storing material.

5. The method of claim 4, wherein the first layer includes a first semiconductor layer having a first conductivity type and a second semiconductor layer having a second conductivity type formed over the first semiconductor layer.

6. The method of claim 1 wherein the first layer includes a metal.

7. The method of claim 1 wherein:
the plurality of nanoclusters have a first pattern over the first layer; and
the patterning the first layer includes forming a plurality of structures having a pattern of generally the first pattern.

8. The method of claim 1 wherein the first layer includes a doped semiconductor material.

9. The method of claim 1 wherein the patterning the first layer includes forming a plurality of patterned structures of the first layer, the method further comprising:
forming a gate, wherein the forming the gate includes forming a layer of gate material over the plurality of patterned structures of the first layer;
wherein the gate is located over patterned structures of the plurality of patterned structures.

10. The method of claim 9 further comprising:
partially oxidizing the plurality of patterned structures prior to the forming the layer of gate material.

11. The method of claim 9 wherein the patterning the first layer includes forming a plurality of patterned structures of the first layer, the method further comprising:
forming a layer of dielectric material over the plurality of patterned structures of the first layer, wherein the layer of gate material is formed over the layer of dielectric material.

12. The method of claim 9 wherein the gate is characterized as a control gate of a transistor, wherein patterned structures of the plurality of patterned structures of the first layer located under the gate are utilized as a plurality of charge storage structures for storing discrete memory states.

13. The method of claim 1 wherein the first capacitor electrode includes conductive material located laterally between the patterned structures of the plurality of patterned structures of the first layer of the second capacitor electrode.

14. The method of claim 1 wherein the patterning the first layer includes forming a plurality of patterned structures of the first layer, the method further comprising:
forming a layer of dielectric material over the plurality of patterned structures of the first layer, wherein material of the layer of dielectric material is located laterally between patterned structures of the plurality of patterned structures of the first layer.

15. The method of claim 1 wherein the plurality of nanoclusters are of a semiconductor material.

16. The method of claim 1 wherein the plurality of nanoclusters include a plurality of nanocrystals.

17. The method of claim 1 wherein the patterning the first layer includes forming a plurality of patterned structures of the first layer, wherein the plurality of patterned structures of the first layer are physically isolated from each other.

18. A method comprising:
forming a first layer;
forming a plurality of nanoclusters over the first layer;
patterning the first layer, wherein the patterning the first layer includes etching using the plurality of nanoclusters as a hard mask, wherein the patterning the first layer includes forming a plurality of patterned structures of the first layer, and wherein a second layer is formed over the first layer and the plurality of nanoclusters are formed over the second layer; and the etching using the plurality of nanoclusters as a hard mask includes etching the second layer using the plurality of nanoclusters as a hard mask to form a plurality of patterned structures of the second layer, wherein the patterning includes etching the first layer using the plurality of patterned structures of the second layer as a hard mask; and
forming a first capacitor electrode of a capacitor, wherein the forming the first capacitor electrode includes forming a layer of conductive material over patterned structures of the plurality of patterned structures of the first layer, wherein a second capacitor electrode of the capacitor includes patterned structures of the plurality of patterned structures of the first layer.

19. A method comprising:
forming a first layer;
forming a plurality of nanoclusters over the first layer;
patterning the first layer, wherein the patterning the first layer includes etching using the plurality of nanoclusters as a hard mask, wherein the patterning the first layer includes forming a plurality of patterned structures of the first layer; and
forming a first capacitor electrode of a capacitor, wherein the forming the first capacitor electrode includes forming a layer of conductive material over patterned structures of the plurality of patterned structures of the first layer, wherein a second capacitor electrode of the capacitor includes patterned structures of the plurality of patterned structures of the first layer; and
forming a gate, wherein the forming the gate includes forming a layer of gate material over the plurality of patterned structures of the first layer, wherein the gate is located over patterned structures of the plurality of patterned structures.

* * * * *